(12) United States Patent
Hazelton (10) Patent No.: US 6,759,851 B2
(45) Date of Patent: Jul. 6, 2004

(54) METHOD AND APPARATUS FOR CONTROL AND FAULT DETECTION OF AN ELECTRIC LOAD CIRCUIT

(75) Inventor: Lawrence Dean Hazelton, Goodrich, MI (US)

(73) Assignee: Delphi Technologies, Inc., Troy, MI (US)

( * ) Notice: Subject to any disclaimer, the term of this patent is extended or adjusted under 35 U.S.C. 154(b) by 126 days.

(21) Appl. No.: 10/188,647

(22) Filed: Jul. 2, 2002

(65) Prior Publication Data

US 2004/0004483 A1 Jan. 8, 2004

(51) Int. Cl.[7] .............................................. G01R 31/08
(52) U.S. Cl. ...................................... 324/522; 324/531
(58) Field of Search ............................... 324/500, 522, 324/537, 531, 532; 340/661; 361/42, 45

(56) References Cited

U.S. PATENT DOCUMENTS

| | | | |
|---|---|---|---|
| 3,604,949 A | | 9/1971 | Conzelmann et al. |
| 4,464,621 A | * | 8/1984 | Prigent et al. ............... 324/522 |
| 5,057,814 A | * | 10/1991 | Onan et al. ................... 340/458 |
| 5,081,404 A | | 1/1992 | Kelley et al. |
| 5,166,852 A | | 11/1992 | Sano |
| 5,173,832 A | | 12/1992 | Giorgetta et al. |
| 5,311,138 A | * | 5/1994 | Ott et al. ...................... 324/503 |
| 5,341,265 A | | 8/1994 | Westrom et al. |
| 5,430,438 A | * | 7/1995 | Joos et al. ...................... 340/3.9 |
| 5,469,825 A | | 11/1995 | Golab et al. |
| 5,481,194 A | | 1/1996 | Schantz |
| 5,491,601 A | | 2/1996 | Arntz |
| 5,508,872 A | | 4/1996 | Khoo |
| 5,561,380 A | * | 10/1996 | Sway-Tin et al. ............ 324/509 |
| 5,572,142 A | | 11/1996 | Muraki |
| 5,638,247 A | | 6/1997 | Loreck |
| 5,737,711 A | | 4/1998 | Abe |
| 5,784,245 A | | 7/1998 | Moraghan |
| 5,790,965 A | | 8/1998 | Abe |
| 5,796,259 A | * | 8/1998 | Dickmander ................. 324/524 |
| 5,939,625 A | | 8/1999 | Torii et al. |
| 5,957,985 A | | 9/1999 | Wong et al. |
| 5,962,934 A | | 10/1999 | Fendt et al. |
| 5,990,647 A | | 11/1999 | Zettler |
| 6,028,431 A | | 2/2000 | Hashida |
| 6,072,955 A | | 6/2000 | Yokouchi et al. |
| 6,147,498 A | | 11/2000 | Sumiya |
| 6,222,374 B1 | | 4/2001 | Shoemaker |
| 6,281,631 B1 | | 8/2001 | Schaffer et al. |
| 6,304,423 B1 | | 10/2001 | Long et al. ................... 361/111 |
| 6,307,376 B1 | | 10/2001 | Alexander et al. |
| 6,324,040 B1 | | 11/2001 | Saladin et al. |

* cited by examiner

Primary Examiner—N. Le
Assistant Examiner—Walter Benson
(74) Attorney, Agent, or Firm—Jimmy L. Funke (57) ABSTRACT

The present invention provides an improvement over conventional electric circuit monitoring devices in that it provides a device and method to passively monitor the performance of an electrical circuit to a load device, including faults that occur intermittently. The invention is capable of identifying the location and type of malfunction in the event of a fault.

23 Claims, 6 Drawing Sheets

NORMAL OPERATION OF CIRCUIT 5

| CONTROL SIGNAL 16 TO SWITCH 20 | CONTROL SIGNAL 18 TO SWITCH 22 | OUTPUT 56 OF COMPARATOR 52 | OUTPUT 58 OF COMPARATOR 54 |
|---|---|---|---|
| OFF | OFF | HIGH | HIGH |
| ON | ON | LOW | LOW |

FIG. 4

FAULT DETECTION OF CIRCUIT 5

| CONTROL SIGNAL 16 TO SWITCH 20 | CONTROL SIGNAL 18 TO SWITCH 22 | OUTPUT 56 OF COMPARATOR 52 | OUTPUT 58 OF COMPARATOR 54 |
|---|---|---|---|
| OFF | OFF | HIGH | LOW |
| OFF | OFF | LOW | HIGH |
| OFF | OFF | LOW | LOW |
| ON | ON | HIGH | LOW |
| ON | ON | LOW | HIGH |
| ON | ON | HIGH | HIGH |

METHOD AND APPARATUS FOR CONTROL AND FAULT DETECTION OF AN ELECTRIC LOAD CIRCUIT

TECHNICAL FIELD

This invention relates to control and diagnosis of driver circuits and wiring harnesses for electrical load devices, including electromagnetic actuators and resistive devices such as lamps.

BACKGROUND OF THE INVENTION

Electric load devices such as electromechanical actuators and lamps are used in a variety of applications in industrial controls, motor vehicles and other devices. Industrial applications include, for example, robotics and electrically controlled valves for chemical process systems. Vehicle applications may include fuel injection systems, electronic transmissions, evaporative purge control systems, antilock braking systems, intake/exhaust valve control systems, lighting systems and others. Typically a circuit will comprise the load device located in a remote area where control or power is needed with a remote driver that is connected to the driver with a wiring harness.

A circuit for an electric load device is used primarily to control the device, but may also be used to monitor performance of the device. When a fault occurs in a circuit, the effect in an industrial setting will be machine downtime and a resulting loss in productivity. The effect on a motor vehicle can include unacceptable system performance and damage to related systems and components, or an increase in emissions of the vehicle. The increase in emissions has become important with the advent of government regulations that compel addition of on-board vehicle diagnostic systems to monitor emissions related components and control systems. The intent of the on-board diagnostic systems is to detect faults that lead to emissions increases.

There is a need to identify a specific location of a fault once it has been detected to ensure that any fault can be quickly located and effectively repaired. This need to identify the location of a fault is important to minimize a loss of productivity associated with machine downtime in a factory, or to minimize costs to diagnose and repair a system on a vehicle.

When a fault occurs in a system, there is a need to identify the type and location of the fault to facilitate repair. When a fault occurs on a vehicle a diagnostic fault indicator may be set. This fault indicator typically will identify the system where a fault has occurred, but will lack sufficient specificity to identify where a specific repair needs to occur. The diagnostic fault indicator will lead a repair technician to a system whose performance may be affected by an interaction of several components or subsystems. The technician may be compelled to work through multiple diagnostic procedures to locate and repair the fault. This consumes time and resources, and results in increased cost and decreased satisfaction to the vehicle owner.

The ability to correctly detect and identify a fault is more difficult when the fault is intermittent, as may occur when there is water intrusion into a wiring harness or connector. A technician will spend time and resources in attempting to reproduce failure conditions to identify a fault or verify a repair. This can result in customer dissatisfaction and high costs to the customer or the manufacturer, due to multiple attempts to identify and repair intermittent faults in a circuit. This problem is apparent when a fault occurs that sets a general diagnostic code that lacks sufficient specificity to identify a needed repair.

Electric load circuits can include devices such as insulated wires, connectors, drive transistors or relays, wiring junctions, and fuses. Faults in the circuit that can lead to undesirable operation of an electric load system include wiring harness shorts to ground, wiring harness open circuits, and wiring harness intermittent connections. Other faults include broken or abraded wires, and connector faults such as relaxation of terminals, or corrosion due to intrusion of water or contaminants.

There are standard methods existing to diagnose and repair faults using off-board techniques such as connectivity tests and diagnostic trouble trees. These methods and tools are contained in service manuals, and are well known in the art. Off-board techniques require the employment of intrusive test methods, including the use of hand held scan tools used by a skilled technician. The prior art has sought to diagnose faults in electrical load circuits on-board the vehicle through the addition of current-monitoring devices that add cost and complexity to the circuit. These may be effective in diagnosing fault in a specific solenoid, but do not diagnose faults in the circuit leading to the electrical device. The prior art has also sought to identify the presence and location of faults with on-board intrusive methods and systems that send a signal through a circuit to a device and look for an subsequent output from the device. These methods can be disruptive when they occur during normal operation of the vehicle or the system. The prior art also has not addressed the issue of identifying the presence of an intermittent fault in a circuit, and the related result of being able to focus the repair efforts of a technician to a specific location in the system.

SUMMARY OF THE INVENTION

The present invention is an improvement over conventional electric circuit monitoring devices in that it provides a device and method to passively monitor the performance of an electrical circuit to a load device, including faults that occur intermittently. The invention is capable of identifying the location and type of malfunction in the event of a fault. Accordingly, the invention provides a complete apparatus and method to control and diagnose driver circuits for electromagnetic actuators and resistive load devices, and detect faults therein.

The present invention includes a circuit and methods that are able to control and monitor an electric load. It includes the electric load, a first switch electrically coupled to a power supply and one end of the electric load, and a second switch electrically coupled between the second end of the electric load and ground. The switches are controlled by a load drive controller that communicates with an external controller. Detection of a fault condition in the circuit occurs by comparing an electric potential at one end of the electric load with a first known potential, and by comparing an electric potential at the second end of the electric load with a second known potential. The circuit accomplishes the comparison using, for example, discrete electronic comparators. The inputs from the electric load and the first and second known potentials are appropriately biased with an effective amount of electric potential to enable detection of a type and location of a fault condition. The output from each of the comparators is communicated as an indication of a fault. This is a passive monitoring system. When a fault is detected, the circuit will operate to identify a location and type of fault, by controlling the switches and monitoring the output of the comparators. The output from the comparators can be communicated to an external controller to indicate the type and location of the fault.

The present invention also comprises a method for controlling and monitoring an electric load. This includes providing a circuit comprising an electric load with a first switch electrically coupled between a power supply and the electric load. The circuit also includes a second switch electrically coupled between the electric load and ground, and a load drive controller operable to control each switch. The method operates by activating the switches. It then compares an electric potential at the first end of the electric load with a first known potential, and also compares an electric potential at the second end of the electric load with a second known potential. The method will then obtain an output from each comparison. The output can then be communicated to an external controller to indicate a fault. The method can also detect the type and location of any fault condition using the comparison of electric potentials. The electric potentials at the first and second ends of the electric load and the first and second known potentials are appropriately biased to detect the type and location of a fault condition. The outputs from the comparisons are then communicated and indicate the type and location of the fault.

A feature of this invention is to provide a circuit to control an electric load and monitor for faults in the circuit. The circuit is also able to identify the type and location of a fault, and communicate this information.

Another feature of this invention is to provide a method for controlling an electric load and monitoring for faults in the circuit. The method is also capable of identifying the type and location of a fault, and communicating this information.

These and other features of the invention will become apparent to those skilled in the art upon reading and understanding the following detailed description of the embodiments.

BRIEF DESCRIPTION OF THE DRAWING

The invention may take physical form in certain parts and arrangement of parts, the preferred embodiment of which will be described in detail and illustrated in the accompanying drawings wherein.

DETAILED DESCRIPTION OF THE INVENTION

Figure 1:
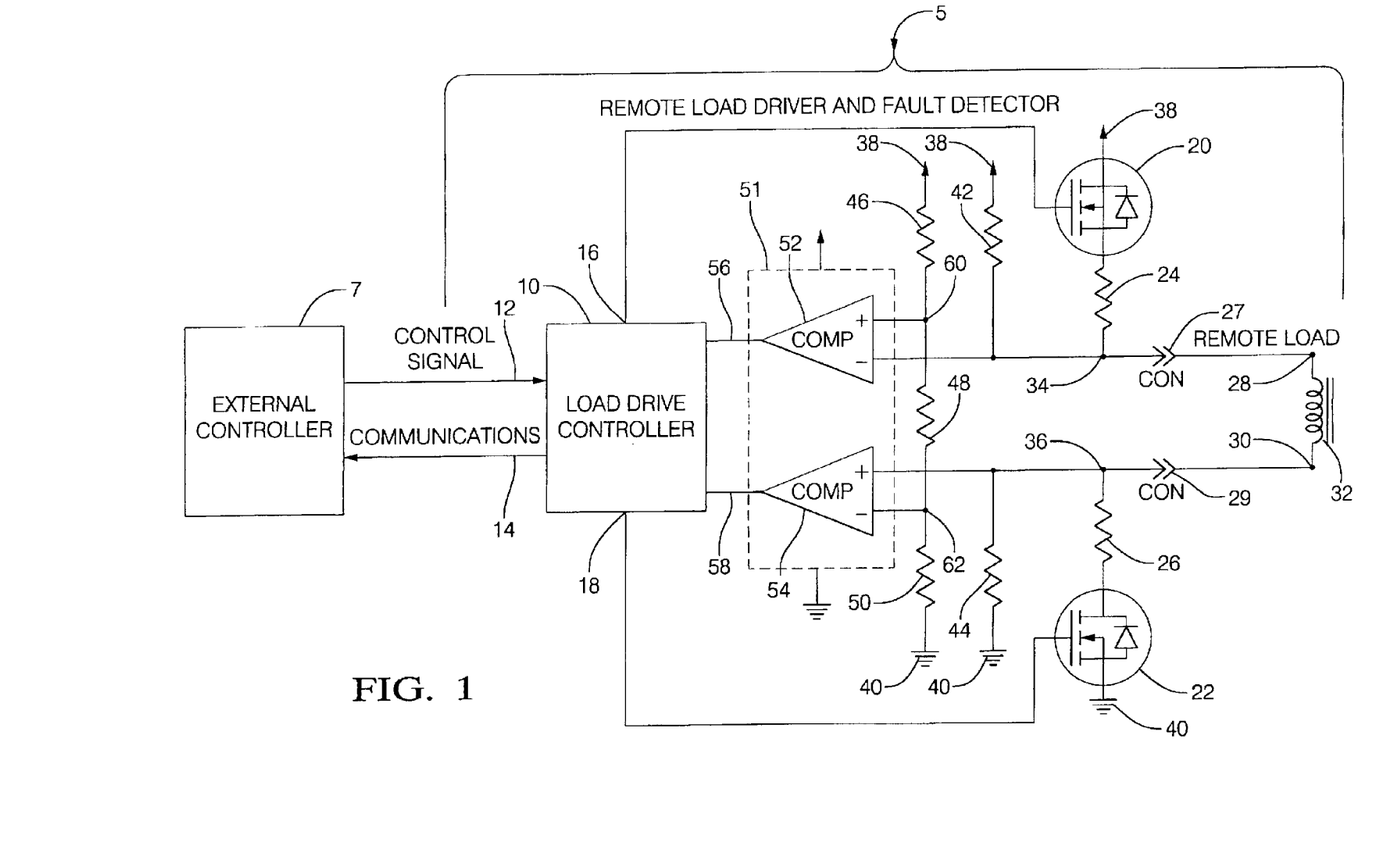
FIG. 1 is a schematic diagram of a circuit for controlling and diagnosing an electric load, in accordance with the present invention.

Referring now to the drawings, wherein the showings are for the purpose of illustrating the preferred embodiment of the invention only and not for the purpose of limiting the same, FIG. 1 shows a schematic diagram of an electrical circuit 5 for control and diagnosis of an electric load 32 that has been constructed in accordance with the present invention. The electric load 32 has a first end 28 that is electrically coupled to a first switch 20, which is placed in series between the first end 28 of the electric load 32 a first electrical potential 38. There is a first resistor 24 placed in series between the first switch 20 and the first end 28 of the electric load 32. There is a third resistor 42 placed in parallel with the series coupled first switch 20 and first resistor 24, between the first electrical potential 38 and the first end 28 of the load 32. A first connector 27 may be placed in between the first end 28 of the load 32 and the first resistor 24.

A second end 30 of the electrical load 32 is electrically coupled to a second switch 22, which is placed in series between the second end 28 and a second electrical potential 40. There is a second resistor 26 placed in series between the second switch 22 and the second end 30 of the electric load 32. There is a fourth resistor 44 placed in parallel with the series coupled second switch 22 and second resistor 26, between the second end 30 of the load 32 and the second electrical potential 40. A second connector 29 may be placed in between the second end 30 of the load 32 and the second resistor 26. The circuit will also contain other elements (not shown) that enable the circuit to accommodate electrical noise, including internally generated noise due to switching or from an external source. The circuit may also contain additional elements (not shown) that enable assembly and operation of the circuit 5. These additional elements (not shown) are known to one skilled in the art.

In a typical embodiment, the load 32 can be an inductive device, such as an electromagnetic solenoid, or a resistive device, such as a lamp. The first electrical potential 38 may be battery voltage, as would be found in a vehicle, or other system voltage typically found in an industrial setting. The second electrical potential 40 can be ground, neutral, or other appropriate level, depending on the system. The load 32 is energized by activating switches 20, 22. The first and second resistors 24, 26 are sized to be approximately equal in resistance levels and small to create a minimum amount of voltage drop in the circuit. The intent in sizing the first and second resistors 24, 26 is to have the electrical potential level at the first end 28 of the load 32 equal to the electrical potential level at the second end 30 of the load 32 under normal conditions when switches 20, 22 are deactivated, in the absence of a fault. A small amount of current will pass through third and fourth resistors 42, 44 when the load 32 is de-energized, i.e. when the switches are deactivated. The third and fourth resistors 42, 44 are sized to be large enough as to not activate the load 32. The third and fourth resistors 42, 44 are intended to appropriately bias the electrical potential levels at the first end 28 and the second end 30 of the load 32 with an effective amount of electric potential to enable detection of one of a type of fault conditions, as will be discussed below. The first and second resistors 24, 26 should be selected to be about 1/100 of the resistance of the load 32, or in the range of 0.1 Ω. The third and fourth resistors 42, 44 should be about 100 times the resistance of the load, or in the range of 10 kΩ.

The switches 20, 22 can be transistors (FET or bipolar), electromagnetic relays, or other devices. The circuit may also contain one or more electrical connectors 28, 30, conductive wire (not detailed), electrical splices (not shown), junction boxes (not shown) or other devices used in connecting load devices to electrical power in a system. The use of alternative devices to switch is known to one skilled in the art.

A load drive controller 10 is operably attached to the first and second switches 20, 22. The load drive controller 10 is operable to receive a control signal on a control line 12 from an external controller 7, and generate control signals 16, 18 to control the switches 20, 22 and therefore control the power delivered to the load 32. The load drive controller 10 is also able to send results on a fault detection line 14 to the external controller 7, based upon other inputs the controller 10 may receive. Another input is discussed below.

Detection of a fault condition in circuit 5 occurs by comparing an electric potential at the first end of the electric load 34 with a first known potential 60, and by comparing an electric potential at the second end of the electric load 36 with a second known potential 62. This comparison can be accomplished by providing a comparison circuit 51 which is comprised of a plurality of comparators 52, 54. Each comparator 52, 54 is preferably a digital device that provides an output that is a logic high signal or logic low signal in response to a comparison of a first and a second input. The first input to each of the comparators is electrically coupled with the electric load 32, either at the first end 28 or the second end 30. The second input to each of the comparators is the first known potential 60 or the second known potential 62. The first known potential 60 and the second known potential 62 are created using a voltage divider device comprised of fifth, sixth, and seventh resistors 46, 48, 50 placed in series between the first electrical potential 38 and the second electrical potential 40. There is a first node 60 at the junction between fifth resistor 46 and sixth resistor 48. This node 60 is electrically coupled to the second input of the first comparator 52. There is a second node 62 at the junction between sixth resistor 48 and seventh resistor 50. This node 62 is electrically coupled to the second input of the second comparator 52. The fifth, sixth and seventh resistors 46, 48, 50 each have substantially the same resistance value. The input impedance and bias current of the comparison circuit 51 determines the actual values. An acceptable range of resistance for each of the fifth, sixth and seventh resistors 46, 48, 50 is 1 kΩ to 100 ΩkΩ. The resistance of fifth, sixth and seventh resistors 46, 48, 50 is driven by electronic design practices understood by one skilled in the art. The outputs 56, 58 of the comparators 52, 54 are electrically coupled to the load drive controller 10, which is able to communicate any fault detection to an external controller 7.

Figure 4:
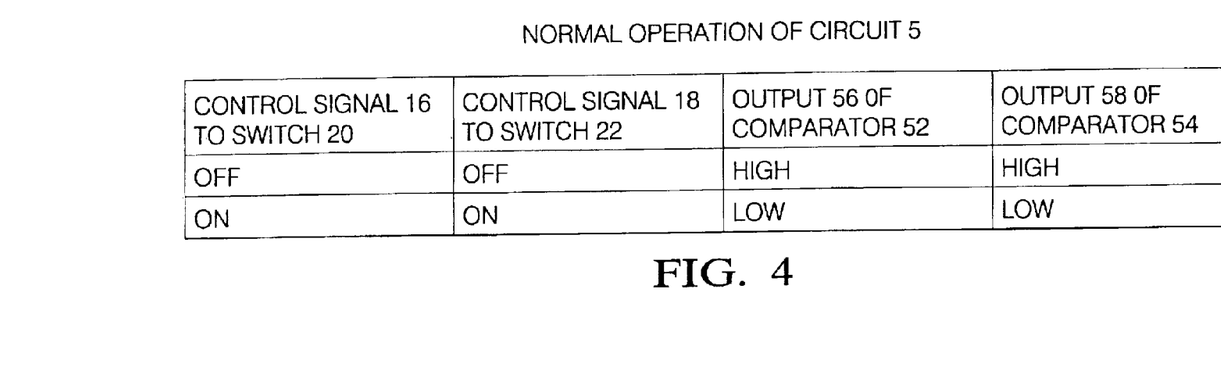
FIG. 4 is a truth table, in accordance with the present invention.

In operation, the circuit functions by providing an output to the external controller 7 indicating electrical integrity of the circuit 5. This can be in the form of a continuous result, or a result that is sent only when a fault is detected. The system is intended to function as follows. The load drive controller 10 will generate signals 16, 18 commanding the switches 20, 22 to close, thus activating the load 32. This is done in response to a control signal 12 from the external controller 5. If there are no faults in the circuit, the outputs 56, 58 of the comparators 52, 54 will both be logic low signals. When the drive controller 10 generates signals 16, 18 commanding the switches 20, 22 to open and thus deactivating the load 32, the outputs 56, 58 of the comparators 52, 54 will both be logic high signals if there are no fault conditions. This can be best described in a truth table as shown in FIG. 4, which demonstrates normal operation of circuit 5.

Figure 5:
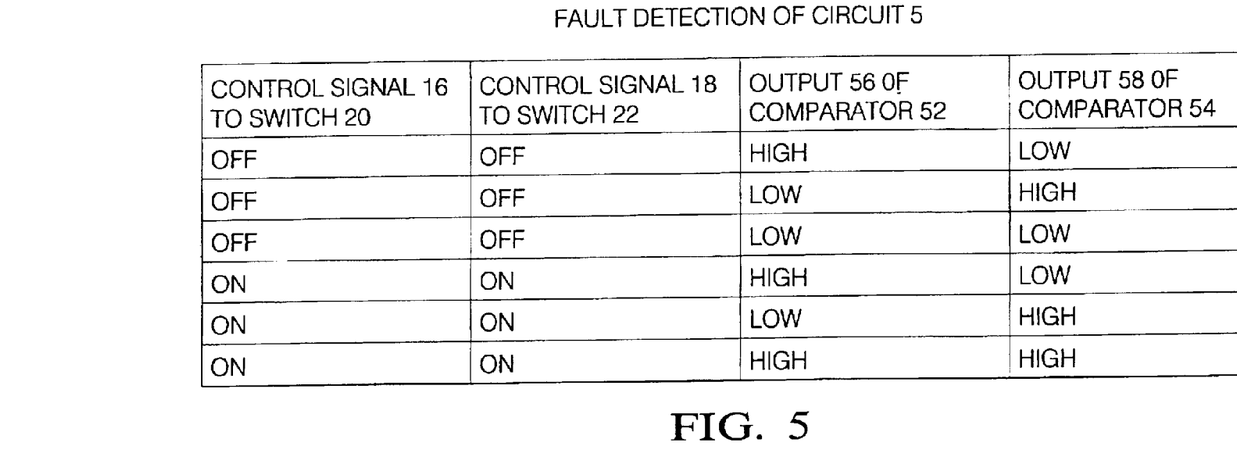
FIG. 5 is another truth table, in accordance with the present invention.

If a fault occurs in circuit 5, one or both of the outputs 56, 58 of the comparators 52, 54 will no longer provide an expected response to the control signals 20, 22. Outputs 56, 58 that indicate a fault in circuit 5 are shown in FIG. 5. The load drive controller 10 will then communicate a first result on the fault detection line 14 indicating that a fault has been detected. The configuration of circuit 5 allows continuous monitoring, both during the time when the load 32 is being powered and when it is not being powered. Therefore, the circuit 5 will be able to detect permanent or intermittent faults. The faults that the circuit will detect include an open circuit (e.g. a broken wire or connector), an internal short in a load, a short in a connector, an open circuit in a switch, a short to a first or second potential, among others. The intermittent faults that the circuit will detect include a weakened connector terminal, a broken or abraded wire, a corroded terminal, among others. The detection of the fault condition will be communicated to the external controller 7 as a first result. No intrusive action will be taken by the external controller 7 or the load drive controller 10 during normal operation.

The invention can also identify of a type of fault condition and its corresponding location, after a fault has been detected, using the circuit 5 as described in FIG. 1. The load drive controller 10 will send a combination of signals 16, 18 intended to indicate the type and location of fault detected. The control signals 16, 18 to the switches 20, 22 are shown in FIG. 5, along with the second outputs 56, 58 of the comparators 52, 54. The second output from the comparators 52, 54 will be provided to the load driver controller 10, which in turn can communicate the type and location of fault as a second result to the external controller 7. The external controller 7 can then use the information to generate actions to prevent further damage to the circuit 5 and the system including, for example, disabling all power to the circuit 5 or the load 32. A technician can also use this information to identify and repair the circuit 5 offline. To identify the type of fault condition and its corresponding location, the load drive controller 10 will control the circuit 5 in an intrusive manner, i.e. it will supply circuit 5 with atypical control signals 16, 18. It is thus able to identify the type and location of faults in the circuit. This will be described in greater detail.

Figure 2:
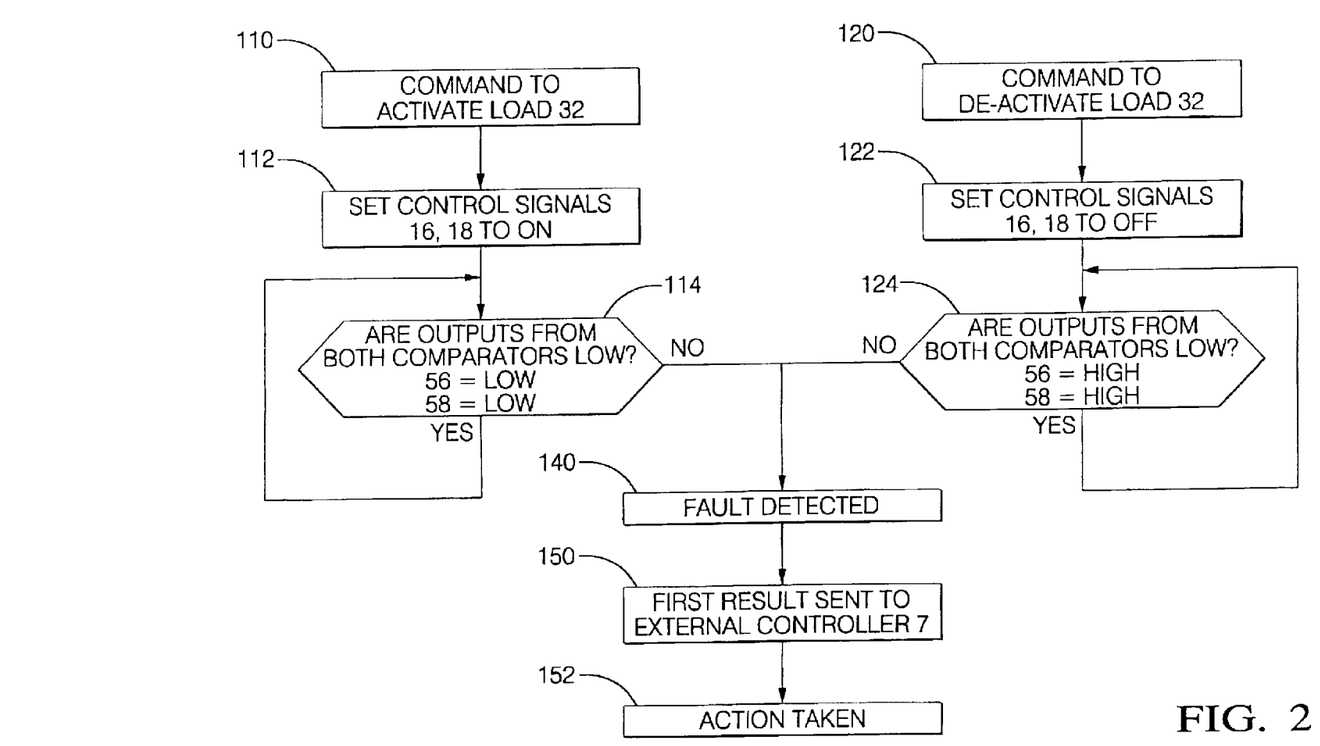
FIG. 2 is a method for monitoring an electric load, in accordance with the present invention.

Referring now to FIG. 2, the invention also includes a method for controlling and monitoring an electric load 32, using the circuit 5. Monitoring of the electric load 32 is passive under normal operation, but will become active if a fault is detected in the circuit 5. The process includes providing circuit 5 that includes an electric load 32 with a first 28 and a second 30 end. There is a first switch 20 electrically coupled between a first electric potential 38 and the first end 28 of the electric load 32, and a second switch 22 electrically coupled between the second end 36 of the electric load 32 and a second electric potential 40. A load drive controller 10 is operable to control each of the switches 20, 22. The controller 10 activates the load 32 by sending control signals 16, 18 and closing both switches 20, 22, in response to a command signal on a control line 12 from an external controller 7. The circuit 5 then compares an electric potential at the first end 28 of the electric load 32 with a first known potential 60, and also compares an electric potential at the second end 30 of the electric load 32 with a second known potential 62. Outputs 56, 58 are obtained from each of the comparisons, and a fault condition is detected in the circuit 5 based upon the outputs 56, 58. The fault condition is then communicated to an external controller 7 as a first result. Each output 56, 58 is preferably a digital signal, and is either a logic low signal or a logic high signal.

To activate the load 32, the external controller 7 will send a command signal to the load drive controller 10 on the control line 12, shown in step 110. The load drive controller 10 will set both control signals 16, 18 to on, thus activating switches 20, 22. This will serve to couple the power supply 38 to the load 32, as shown in step 112. In step 114, the load drive controller 10 will continuously monitor the outputs 56, 58 of the comparators 52, 54. No action is taken as long as both outputs 56, 58 are low when the control signals 16, 18 are on.

To deactivate the load 32, the external controller 7 will send a command signal on the control line 12 to the load drive controller 10, as shown in step 120. The load drive controller 10 will set the control signals 16, 18 to off, thus deactivating switches 20, 22. This will serve to disconnect the power supply 38 to the load 32, as shown in step 122. In step 124, the load drive controller 10 will continuously monitor the outputs 56, 58 of the comparators 52, 54. No action is taken as long as both outputs 56, 58 are high when the control signals 16, 18 are off. This method of monitoring the circuit 5 is passive, and provides an ongoing indication of the integrity of the circuit 5 during normal operation.

If a fault is detected, as shown in step 140, a first result, representing fault detection, will be sent to the external controller 7 on a fault detection line 14, as shown in step 150. This first result is comprised of the outputs 56, 58 of the comparators 52, 54, and is sent whether the fault is continuous or is intermittent. The external controller 7 will then decide on appropriate actions to deal with a fault, as shown in step 152. These actions in step 152 can include actions outside the circuit 5, such as signaling to the operator that a fault has occurred, disabling all control to the load drive controller 10, or storing the fault information for further diagnostic analysis. There may also be other actions to protect the circuit 5 or the load 32 or to maintain operation of the system that have not been described.

Figure 3A:
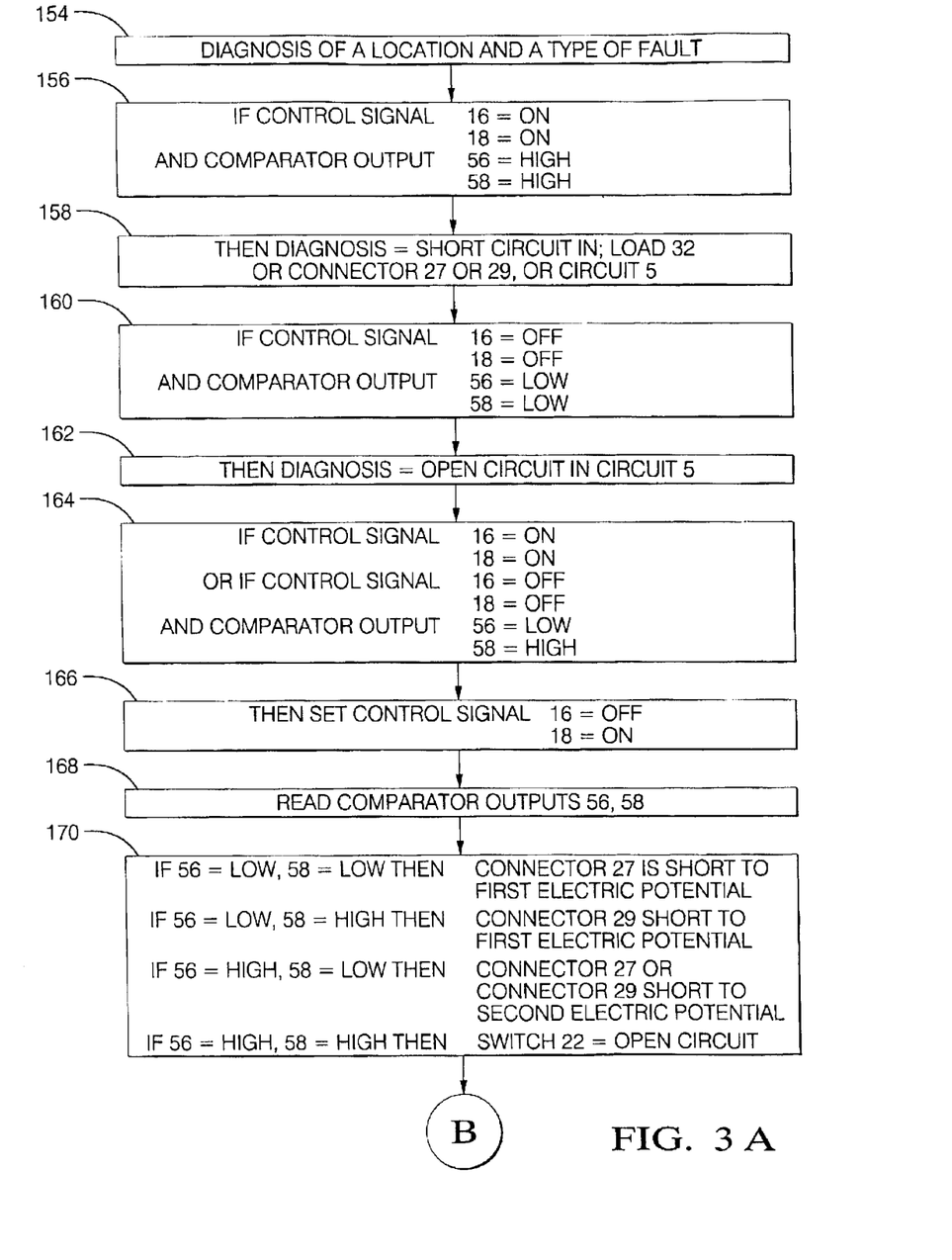
FIG. 3 is a method for identifying an location and type of fault, in accordance with the present invention.
Figure 3B:
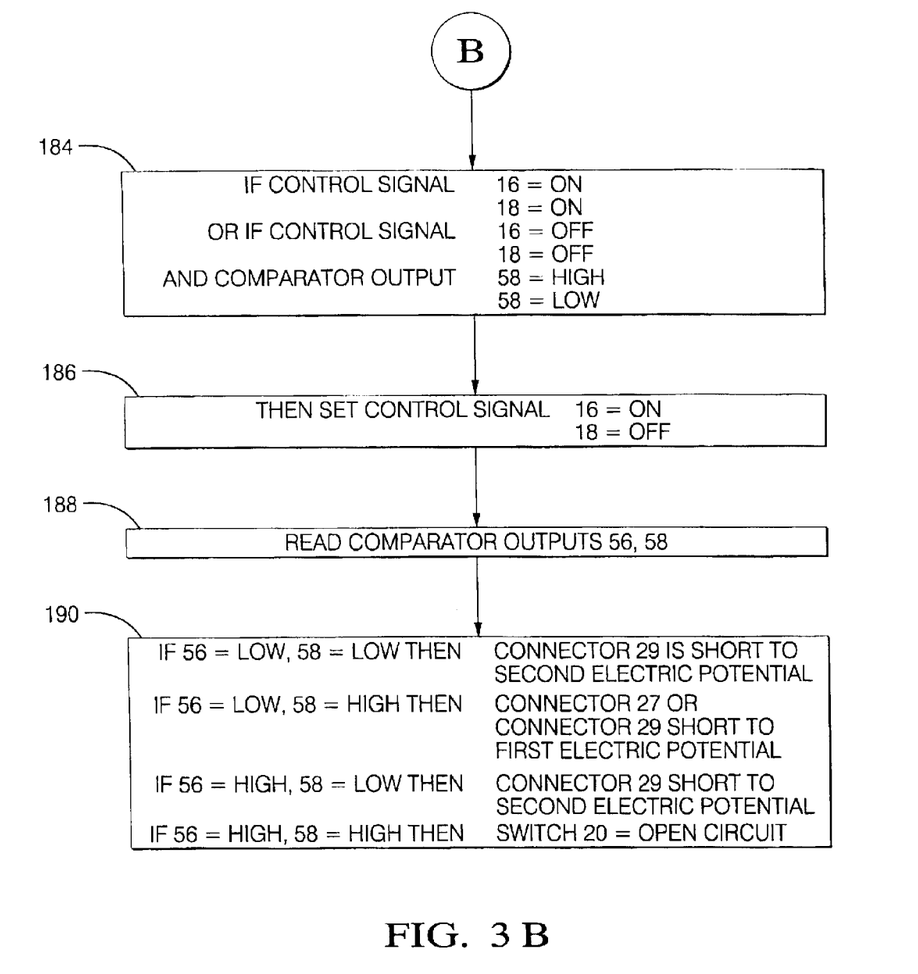

Referring now to FIG. 3, once a fault has been detected in step 140 (shown in FIG. 2), the method will then act intrusively to diagnose a location and type of fault. The method begins by interpreting the outputs 56, 58 of the comparators 52, 54, as shown in step 154. When the signals 16, 18 are both on and the corresponding outputs 56, 58 are both high, shown in step 156, then the method will diagnose a short circuit in the load 32, or a short circuit in a connector 28, 30 or another part of the circuit 5. This is shown in step 158, and in Table 1, below. A second result, representing the type and location of the fault, is then communicated to the external controller 7, and there will be no further diagnostic action in the circuit. This result can then be retrieved by a repair technician and used to repair the circuit 5.

TABLE 1

| Control signal 16 to Switch 20 | Control signal 18 to Switch 22 | Output 56 of Comparator 52 | Output 58 of Comparator 54 | Type and Location of Fault |
|---|---|---|---|---|
| On | On | High | High | Internal short to load 32, or short circuit between connector 27 and connector 29 |

When the corresponding outputs 56, 58 are not both high or both low, intrusive actions are taken to identify a type of fault and a location of a fault in the electric load 32. When output 56 is low and output 58 is high, as shown in step 164, the load drive controller 10 will set control signal 16 to off, thus deactivating switch 20, and also set control signal 18 to on, thus activating switch 22. Diagnosis will occur by reading the outputs 56, 58, as shown in step 168, and interpreting the results, as shown in step 170. The results are also summarized below in Table 3.

TABLE 3

| Control signal 16 to Switch 20 | Control signal 18 to Switch 22 | Output 56 of Comparator 52 | Output 58 of Comparator 54 | Type and Location of a Fault |
|---|---|---|---|---|
| Off | On | Low | Low | Connector 27 short to $1^{st}$ potential 38 |
| Off | On | Low | High | Connector 29 short to $1^{st}$ potential 38 |
| Off | On | High | Low | Connector 27 or 29 short to $2^{nd}$ potential 40 |
| Off | On | High | High | $2^{nd}$ Switch 22 open circuit |

When output 56 is high and output 58 is low, as shown in step 184, the load drive controller 10 will set control signal 16 to on, thus activating switch 20, and also set control signal 18 to off, thus deactivating switch 22 (step 186). Diagnosis will occur by reading the outputs 56, 58 (step 188) and interpreting the results (step 190). The results are also summarized below in Table 4.

TABLE 4

| Control signal 16 to Switch 20 | Control signal 18 to Switch 22 | Output 56 of Comparator 52 | Output 58 of Comparator 54 | Type and Location of a Fault |
|---|---|---|---|---|
| On | Off | Low | Low | Connector 29 short to $2^{nd}$ potential 40 |
| On | Off | Low | High | Connector 27 or 29 short to $1^{st}$ potential 38 |
| On | Off | High | Low | Connector 27 short to $2^{nd}$ potential 40 |
| On | Off | High | High | $1^{st}$ Switch 20 open circuit |

In this embodiment, the load drive controller 10 is operably coupled to the external controller 7, such that the load drive controller 10 is responsive to input from the external controller 7. This input includes information to activate the switches 20, 22 to control and monitor the load 32 and to identify the type and location of a fault. This operable connection will also enable the load drive controller 10 to communicate to the external controller 7 either a first result that represents the first output of the comparators, or a second result that represents the second output of the comparators.

The external controller 7 may instead comprise a switch activated by an operator, such as when operating a lamp or robotic device. In this configuration, the fault detection line 14 can be directly coupled to a fault indicator lamp instead of to the external controller 7. The method shown in FIG. 3 of interpreting the comparator output (step 154), setting control signals (step 166 or 168) and diagnosing a type and location of fault (step 170 or step 190) can be accomplished by the load drive controller 10 or by other external methods.

Figure 6:
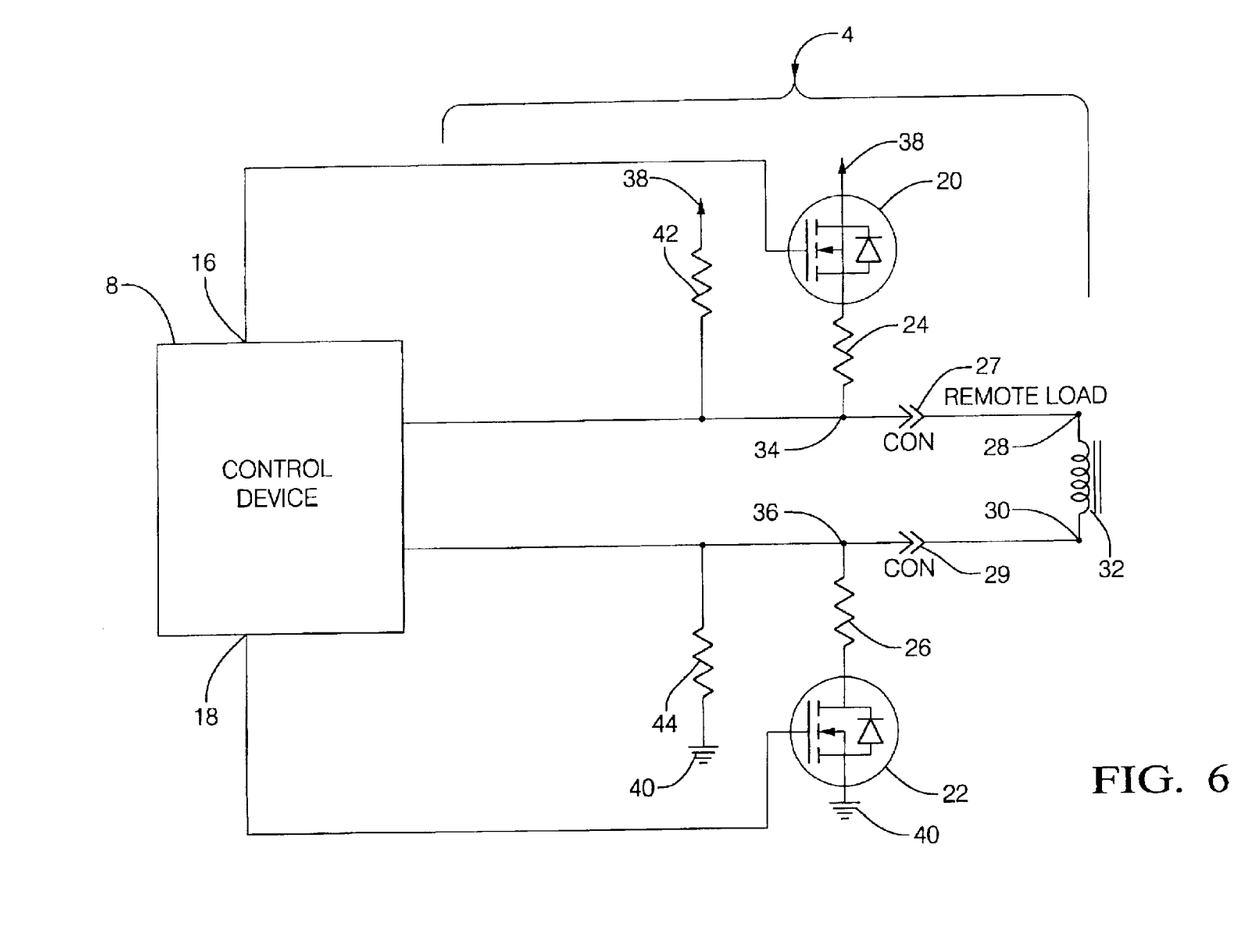
FIG. 6 is another schematic diagram of a circuit for controlling and diagnosing an electric load, in accordance with the present invention.

FIG. 6 shows another embodiment of the invention wherein the functions of the comparison circuit 51 and the load drive controller 10 are accomplished in a control device 8. Control device 8 can comprise the load drive controller 10, the external controller 7, and the comparison circuit 51, as well as other functions. In this embodiment control device 8 is designed to perform the same functions as the discrete components shown in FIG. 1. For example, when the comparison circuit 51 is internal to the control device 8 it can take the form of an electronic circuit or an algorithm that is designed to perform the same functions as the comparison circuit 51 to achieve the same result. The use of algorithms and up-integrated components to compare voltage levels is known to one skilled in the art. In this embodiment the electric potentials at node 1 34 and node 2 36 are input directly to the control device 8, using an analog to digital converter (not shown). The load 32 and other elements of circuit 4 will be analogous to those shown in circuit 5 (FIG. 1). For example, the other inputs to the comparators, i.e. the first known potential 60 and the second known potential 62, can be created within the control device 8. In this embodiment the control device 8 will perform the functions of operating the switches 22, 24 and comparing the electrical potentials at node 1 34 and node 2 36 with the first known potential 60 and the second known potential 62.

The invention may be used to monitor load devices in vehicle systems including, inter alia, braking systems, fuel injectors, EGR valves, transmission solenoids, purge control valves, cam phasers, headlamps, taillamps, and signal lamps. The invention may also be used to monitor load devices in industrial settings such as control solenoids and lamps, among others.

System requirements, circuit design factors or communications protocols may drive the designer to configure the circuit differently. For example, the load drive controller 10 may be up-integrated into the external controller 7; the outputs 56, 58 from the comparators 52, 54 may be communicated directly to the external controller 7; or, the load drive controller 10 may have other diagnostic and control capabilities in addition to those mentioned in the invention. In addition, some or all of the elements of the circuit 5 may be integrated into the load 32, the external controller 7, or the connectors 27, 29. The components of circuit 5 may or may not be discrete elements.

The circuit 5 can also include other elements, not shown. These may include additional connectors, splices, or fusible links, for example. The invention for diagnosis and control of the circuit will include monitoring those devices that are part of the function of a circuit that controls the load.

Circuit design factors and communications protocols may also drive changes to the circuit in other ways also. The invention encompasses the various alternative designs. For example, the inputs to the comparators can be reconfigured to provide different outputs in response to control signal inputs.

The invention has been described with specific reference to the preferred embodiments and modifications thereto. Further modifications and alterations may occur to others upon reading and understanding the specification. It is intended to include all such modifications and alterations insofar as they come within the scope of the invention.

What is claimed is:

1. A circuit to control and monitor an electric load having a first and a second end, comprising:
    a first switch electrically coupled between a first electric potential and said first end of the electric load;
    a second switch electrically coupled between said second end of the electric load and a second electric potential;
    a load drive controller operable to control each of said switches; and
a comparison circuit for detecting a fault condition in said circuit by comparing an electric potential at said first end of the electric load with a first known potential and by comparing an electric potential at said second end of the electric load with a second known potential; wherein the comparison circuit comprises a plurality of comparators such that a first input to each of said comparators is in electrical contact with said electric load, and a second input to each of said comparators comprises the first or the second known potential; and,
wherein said each switch and the first and second known potentials are appropriately biased with an effective amount of electric potential to enable detection of a type and location of a fault condition.

2. The circuit of claim 1, wherein the load drive controller is operably coupled to an external controller to receive a control signal and to send a fault detection result.

3. The circuit of claim 2, wherein the load drive controller is operable to control each of said switches in a manner such that a first output from the comparison circuit indicates a fault condition.

4. The circuit of claim 2, wherein the load drive controller is operable to control each of said switches in a manner such that a second output from the comparison circuit indicates the type and location of a fault condition.

5. The circuit of claim 1, wherein the output from each said comparator is either a logic high or logic low.

6. The circuit of claim 1, wherein the electric load comprises an inductive device.

7. The circuit of claim 1, wherein the electric load comprises a resistive device.

8. The circuit of claim 1, wherein each said switch comprises a field effect transistor.

9. The circuit of claim 1, wherein each said switch comprises a bipolar transistor.

10. The circuit of claim 1, wherein each said switch comprises an electromagnetic relay.

11. The circuit of claims 1, wherein the first electric potential is battery voltage in a vehicle electrical system.

12. The circuit of claim 1, wherein the second electric potential is ground in a vehicle electrical system.

13. The Circuit of claim 1, wherein the first electric potential is a preset voltage.

14. The circuit of claims 1, wherein the second electric potential is a neutral voltage.

15. A circuit to control and monitor an electric load having a first and a second end, comprising:
    a first switch electrically coupled between a first electric potential and said first end of the load;
    a second switch electrically coupled between said second end of the electric load and a second electric potential;
    a load drive controller operable to control each of said switches; and
a comparison circuit for detecting a fault condition in said circuit by comparing an electric potential at said first end of the electric load with a first known potential and by comparing an electric potential at said second end of the electric load with a second known potential;
wherein the comparison circuit corn rises a plurality of comparators such that a first in up to each of said comparators is in electrical contact with said electric load, and a second input to each of said comparators comprises the first or the second known potential;
wherein said each switch and the first and second known potentials are appropriately biased with an effective amount of electric potential to enable detection of a type and location of a fault condition;
wherein the load drive controller is operably counted to an external controller to receive a control signal and to send a fault detection result; and,
wherein the comparator circuit is internal to said external controller.

16. A circuit for control and diagnosis of an electric load having a first and a second end, comprising:
- a first switch electrically coupled between a first electric potential and said first end of the electric load;
- a second switch electrically coupled between said second end of the electric load and a second electric potential;
- a load drive controller operable to control each of said switches; and
- a plurality of comparators, wherein a first input to each of said comparators is in electrical contact with said electric load with an appropriate bias potential, and a second input to each of said comparators comprises a first or a second known potential; and an output from each said comparator;
- wherein the load drive controller is operable to control each said switch in a manner such that the output from each said comparator indicates a fault condition in said circuit; and,
- wherein the load drive controller is operably coupled to an external controller, such that the load drive controller responsive to an input from said external controller, and is capable of communicating a first result indicating said fault condition to said external controller.

17. The circuit in claim 16, wherein detection of a fault condition in said circuit occurs during operation of said load.

18. The circuit of claim 16, wherein the load drive controller is operable to control each said switch in a manner such the output from each said comparator indicates a type and location of said fault condition.

19. The circuit in claim 18, wherein the load drive controller is operably coupled to an external controller, such that the load drive controller is responsive to an input from said external controller, and is able to communicate a second result indicating said type and location of said fault condition to said external controller.

20. A method for controlling and monitoring an electric load, comprising:
- providing a circuit comprising an electric load with a first and a second end, a first switch electrically coupled between a first electric potential and said first end of the electric load, a second switch electrically coupled between said second end of the electric load and a second electric potential, a load drive controller operable to control each of said switches;
- activating said first and second switches;
- comparing an electric potential at said first end of the electric load with a first known potential and comparing an electric potential at said second end of the electric load with a second known potential; and
- obtaining an output from each said comparison;
- wherein the step of activating said first and second switches comprises controlling each of said switches in a manner that will identify a type and location of a fault condition.

21. The method of claim 20, further comprising detecting a type and location of a fault condition in said circuit from the output from each said comparison.

22. The method of claim 21, further comprising communicating the type and location of a fault condition as a second result to an external controller.

23. A method for controlling and monitoring an electric load, comprising:
- providing a circuit comprising an electric load with a first and a second end, a first switch electrically coupled between a first electric potential and said first end of the electric load, a second switch electrically coupled between said second end of the electric load and a second electric potential, a load drive controller operable to control each of said switches;
- activating said first and second switches;
- comparing an electric potential at said first end of the electric load with a first known potential and comparing an electric potential at said second end of the electric load with a second known potential; and
- obtaining an output from each said comparison
- wherein the load drive controller is operably coupled to an external controller, such that the load drive controller is responsive to an input from an external controller and is able to communicate a second result indicating a type and location of said fault condition to said external controller.

* * * * *